United States Patent [19]

Iwasawa et al.

[11] Patent Number: 5,344,740
[45] Date of Patent: Sep. 6, 1994

[54] POSITIVE-TYPE PHOTOSENSITIVE ELECTRODEPOSITION COATING COMPOSITION CONTAINING QUINONEDIAZIDE RESIN HAVING AN ANION-FORMING GROUP AND A NITROGEN-CONTAINING COMPOUND AND PROCESS FOR PRODUCING CIRCUIT PLATE USING SAME

[75] Inventors: Naozumi Iwasawa; Junichi Higashi; Shinsuke Onishi, all of Hiratsuka, Japan

[73] Assignee: Kansai Paint Co., Ltd., Hyogo, Japan

[21] Appl. No.: 879,101

[22] Filed: May 4, 1992

Related U.S. Application Data

[63] Continuation of Ser. No. 552,682, Jul. 11, 1990, abandoned.

[30] Foreign Application Priority Data

Jul. 12, 1989 [JP] Japan .................................. 1-178042

[51] Int. Cl.$^5$ ..................... G03F 7/023; G03F 7/30
[52] U.S. Cl. ..................... 430/191; 430/165; 430/190; 430/193; 430/313; 430/318; 430/323; 430/326; 430/329
[58] Field of Search ............... 430/191, 190, 192, 193, 430/165, 168, 169, 313, 318, 323, 326, 329

[56] References Cited

U.S. PATENT DOCUMENTS

| | | | |
|---|---|---|---|
| 3,661,582 | 5/1972 | Broyde | 430/191 |
| 4,365,019 | 12/1982 | Daly et al. | 430/191 |
| 5,055,374 | 10/1991 | Seio et al. | 430/190 |

*Primary Examiner*—Charles L. Bowers, Jr.
*Assistant Examiner*—Christopher G. Young

*Attorney, Agent, or Firm*—Wenderoth, Lind & Ponack

[57] ABSTRACT

A positive-type photosensitive electrodeposition coating composition comprising
(A) a resin component containing in a molecule at least one unit selected from the group consisting of an ortho-benzoquinonediazidesulfone unit represented by the general formula

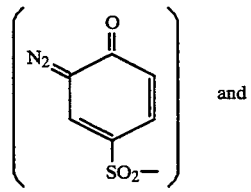 and an ortho-naphthoquinonediazidesulfone unit represented by the general formula

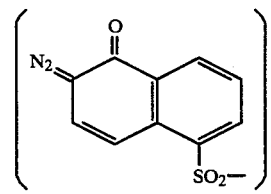

as a photosensitive group, and an anion-forming group; and
(B) at least one of the specified particular nitrogen-containing compounds. The composition is useful for the production of a circuit plate.

7 Claims, No Drawings

POSITIVE-TYPE PHOTOSENSITIVE ELECTRODEPOSITION COATING COMPOSITION CONTAINING QUINONEDIAZIDE RESIN HAVING AN ANION-FORMING GROUP AND A NITROGEN-CONTAINING COMPOUND AND PROCESS FOR PRODUCING CIRCUIT PLATE USING SAME

This application is a continuation of now abandoned application Ser. No. 07/552,682, filed Jul. 11, 1990.

This invention relates to a positive-type photosensitive electrodeposition coating composition, and more specifically, to an anionic electrodeposition coating composition suitable for forming a printed wiring photoresist by coating an electrically conductive material-clad laminated plate by electrodeposition to form a non-tacky smooth film whose portion exposed to actinic rays such as ultraviolet light through a positive photomask can be washed away with a developing solution.

In the prior art, a printed wiring board for use in an integrated circuit or the like is formed by plating a laminated plate obtained by cladding an insulator with an electrically conductive material such as a copper foil, laminating a photosensitive film, overlaying a photographic negative on it, exposing the photosensitive film through the negative, removing the unexposed portion, etching away the unnecessary electrically conductive material from the circuit pattern, and thereafter removing the photosensitive film on the circuit pattern. Since the photosensitive film is generally as thick as 50 micrometers, the circuit pattern formed by exposure and development is not sharp, and moreover, it is difficult to laminate the photosensitive film uniformly to the surface of the electrically conductive material. In particular, it is almost impossible to protect the metal on through-hole portions with the photosensitive film.

A method is also known to form a circuit pattern for printed wiring which comprises applying an etching resist ink to a metal-clad laminated plate having a through-hole portion by screen printing, etching the laminated plate to remove copper from the non-printed-portion, and removing the resist ink in the printed portion. According to this method, the ink is difficult to coat on the through-hole portion, and the metal in the through-hole portion is frequently removed by the etching treatment. To avoid this, it is also the practice to embed an organic material in the through-hole portion so as to prevent the metal in the through-hole portion from being removed by the etching treatment, and finally remove the organic material. This method, however, has the defect that the cost of the circuit plate finally obtained is high and the circuit pattern has low sharpness.

As improvements over these prior methods, U.S. Pat. Nos. 4,632,900 and 4,673,458 disclose a method which comprises forming a positive-type photosensitive resin resist on a printed wiring board, overlaying a photographic positive on it, exposing the board through the positive, and removing the exposed portion with an aqueous alkaline solution to form an image. Since according to this method, a coating can be formed easily on the through-hole portion by electrodeposition and the unexposed portion remains as a resist coating, a printed wiring board having excellent resolution can be obtained.

However, when the positive-type photosensitive anionic electrodeposition coatings used in the above documents are coated on electrically conductive substrates by electrodeposition, metals such as copper, etc. making up the substrates are eluted into the electrodeposition bath by the electrode reaction to form salts or chelates with anion-forming groups in the resins. Accordingly, there are defects that the resins are thereby rendered high-molecular-weight in the electrodeposition coating bath with the lapse of time and solubility of the resist films coated on the substrates decreases, worsening developability.

The present inventors have made extensive studies to remedy these defects, and consequently found that the aforesaid problems can be solved by adding a specific nitrogen-containing compound such as a triazole, a pyrazole or an oxalic acid anilide to the positive-type photosensitive anionic electrodeposition coating. This finding has lead to completion of this invention.

This invention thus provides a positive-type photosensitive anionic electrodeposition coating composition comprising (A) a resin component containing in a molecule at least one unit selected from the group consisting of an ortho-benzoquinonediazidesulfone unit represented by the following general formula

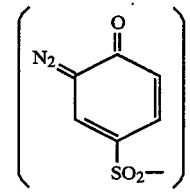

and an ortho-naphthoquinonediazidesulfone unit represented by the following general formula

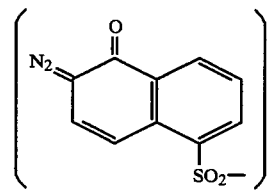

as a photosensitive group, and an anion-forming group; and (B) at least one of the nitrogen-containing compounds represented by the following general formulae (1) to (6):

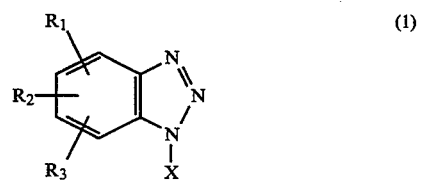

(1)

wherein X represents a hydrogen atom or a hydroxyl group, $R_1$, $R_2$ and $R_3$ independently represent a hydrogen atom, a chlorine atom or an alkyl group having 1 to 6 carbon atoms,

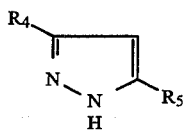

(2)

wherein $R_4$ and $R_5$ independently represent a hydrogen atom, or an alkyl group having 1 to 6 carbon atoms,

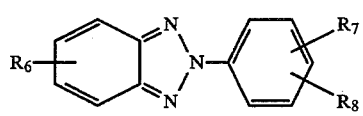

(3)

wherein $R_6$, $R_7$ and $R_8$ independently represent a hydrogen atom, a hydroxyl group or an alkyl group having 1 to 12 carbon atoms,

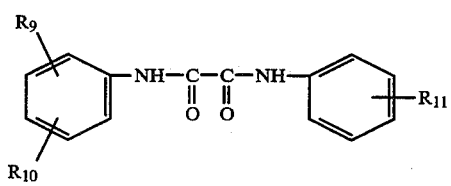

(4)

wherein $R_9$, $R_{10}$ and $R_{11}$ independently represent a hydrogen atom, a hydroxyl group, an alkyl group having 1 to 12 carbon atoms or an alkoxy group having 1 to 12 carbon atoms,

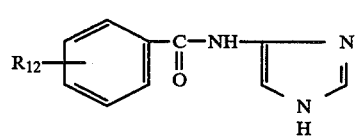

(5)

wherein $R_{12}$ represents a hydrogen atom, a hydroxyl group, an alkyl group having 1 to 12 carbon atoms or an alkoxy group having 1 to 12 carbon atoms,

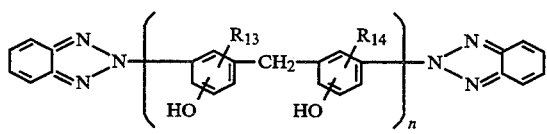

(6)

wherein $R_{13}$ and $R_{14}$ independently represent a hydrogen atom or an alkyl group having 1 to 12 carbon atoms and n is an integer of 1 to 3.

This invention further provides a process for producing a circuit plate, which comprises (i) a step of coating the aforesaid electrode-position coating composition on a surface of a circuit substrate having an electrically conductive coating to form a positive-type photosensitive coating, (ii) a step of exposing the positive-type photosensitive coating to light via a pattern mask, (iii) a step of forming an etching pattern by removing the photosensitive coating in the exposed portion, (iv) a step of removing the exposed electrically conductive coating by etching, and (v) removing the photosensitive coating on the circuit pattern.

This invention will be described in more detail below.

Resin Component (A)

The resin component (A) used in the electro-deposition coating composition of this invention is not limited in particular if it can be formed in an aqueous solution or an aqueous dispersion by neutralization to provide a continual coating on an electrically conductive substrate by electrodeposition coating and the exposed portion in the coating can be eluted with a developer. Any resins known in the art are available as said resin component (A).

The resin supporting the photosensitive group and the anion-forming group is not limited in particular if it shows the above characteristics. Concrete examples of said resin are an acrylic resin, a polyester resin, an epoxy resin, a phenolic resin and a vinyl phenol polymer or copolymer. Above all, the acrylic resin is advantageous because it can easily introduce the photosensitive group and the anion-forming group.

Regarding the resin component (A) in this invention, it is not altogether necessary that the photosensitive group and the anion-forming group are contained in the same resin molecule; they may be present in the form of a mixture comprising a compound or resin supporting the photosensitive group and a resin containing the anion-forming group (free from the photosensitive group). Examples of the compound or resin supporting the photosensitive group are, other than the aforesaid resins, polyhydroxybenzophenone, polyhydroxybenzene, polyisocyanates, polyhydric alcohols, and a pyrogallol/aldehyde condensate.

The photosensitive group can be introduced into the above compound or resin in a manner known per se using ortho-benzoquinonediazidesulfonic acid, orthonaphthoquinonediazidesulfonic acid or their halides (hereinafter simply called a "quinonediazide compound"). For instance, it can be conducted by reacting a compound or resin having a phenolic or alcoholic hydroxyl group with the quinonediazide compound to form a sulfonic acid ester (see e.g. U.S. Pat. No. 4,673,458), or by reacting an alkanolamine (e.g. ethanolamine, neopentanolamine or N-methylethanolamine) with the quinonediazide compound to form a sulfoneamide or a sulfoneimide compound, and reacting the resulting hydroxyl group-containing quinonediazide compound with e.g. a compound or resin containing an isocyanate group (see e.g. European Patent No. 0 315 165 A2).

Desirable examples of the quinonediazide compound are 1,2-benzoquinonediazide-4-sulfonic acid chloride and 1,2-naphthoquinonediazide-5-sulfonic acid chloride. In the introduction of the photosensitive group into the resin, the latter method of introducing the photosensitive group via a sulfoneamide linkage or a sulfoneimide linkage and an urethane linkage is more advantageous because of excellent resistance to hydrolysis and operation stability of the electrodeposition coating bath.

In the latter method, the resin component (A) can be produced by reacting the hydroxyl group-containing quinonediazide compound with an isocyanate group-containing vinyl monomer (e.g. isocyanate ethyl (meth)acrylate, m-propenyl-alpha,alpha-dimethylbenzylisocyanate or a reaction product of equimolar amounts of a hydroxyl group-containing (meth)acrylic acid ester and a diisocyanate), and copolymerizing the resulting monomer with an acid group-containing unsaturated monomer (e.g. (meth)acrylic acid or maleic acid) and if required, the other radical unsaturated monomer; or reacting the hydroxyl group-containing quinonediazide compound with a copolymer having an isocyanate group and an acid group.

The amount of the photosensitive group in the resin component (A) used in this invention is usually 5 to 60% by weight, preferably 10 to 50% by weight. When the amount of the photosensitive group is less than 5% by weight, the amount of a ketene in the photosensitive group of the coated film becomes small and the amount of the carboxylic acid is small, so that development with a weak alkali becomes difficult. When said amount is larger than 60%, a glass transition temperature (Tg) of the resin becomes high and the electrodeposition coated film becomes hard so that cracking tends to occur.

Examples of the anion-forming group being introduced into the resin component (A) are a carboxyl group, a sulfonic acid group and a phosphoric acid group. Above all, the carboxylic acid is preferable. Its content can be 0.2 to 4.5 mols, preferably 0.4 to 2.0 mols per kilogram of the resin solids content. When the amount of the anion-forming group is less than 0.2 mol, water-solubility or water-dispersibility is less expected, making it hard to prepare an electrodeposition coating composition. Meanwhile, when said amount exceeds 4.5 mols, the electrodeposition coating is hardly coated on the substrate, and the larger amount of coating requires a higher power.

Though the molecular weight of the resin varies with the type of the resin, the number-average molecular weight is usually 3,000 to 100,000, preferably 5,000 to 30,000. When the number-average molecular weight is less than 3,000, the film coated in the electrodeposition coating is liable to be broken, and the uniform coated film is not obtained frequently. When it is more than 100,000, a surface smoothness of the electrodeposition coated film decreases to give an uneven coated surface, decreasing image resolution.

The resin component (A) having the photosensitive group and the anion-forming group is neutralized with an amine or alkali compound, and the neutralized product is dispersed or dissolved in water and applied to the electrodeposition coating composition of this invention. Examples of a neutralizing agent used are alkanolamines such as monoethanolamine, diethanolamine and triethanolamine; alkylamines such as triethylamine, diethylamine, monoethylamine, diisopropylamine, trimethylamine and diisobutylamine; alkylalkanolamines such as dimethylaminoethanol; alicyclic amines such as cyclohexylamine; alkali metal hydroxides such as sodium hydroxide and potassium hydroxide; and ammonia.

In this invention, the photosensitive group and the anion-forming group may be supported on the separate resins or compounds in the form of a mixture, if the same photosensitive group and anion-forming group as in the above resin are contained in the mixture in the same amounts as in the above resin.

The number-average molecular weight of the resin supporting the anion-forming group and free from the photosensitive group is usually 3,000 to 100,000, preferably 5,000 to 30,000.

It is advisable that the resin or compound supporting the photosensitive group contains in one molecule at least 1 photosensitive group, preferably on the average at least 1.5 photosensitive groups and has the number-average molecular weight of 10,000 or less, preferably 500 to 5,000. When the molecular weight exceeds 10,000, a compatibility with a resin containing an anion-forming group tends to decrease.

The resin component (A) composed of the above mixture can be used by being neutralized with an amine compound, etc. and dispersed or dissolved into water as stated above.

Nitrogen-containing Compound (B)

At least one of the nitrogen-containing compounds constituting the electrodeposition coating composition of this invention is selected from the group consisting of the following compounds, examples thereof being shown below.

Compound of the above formula (1):
Benzotriazoles such as

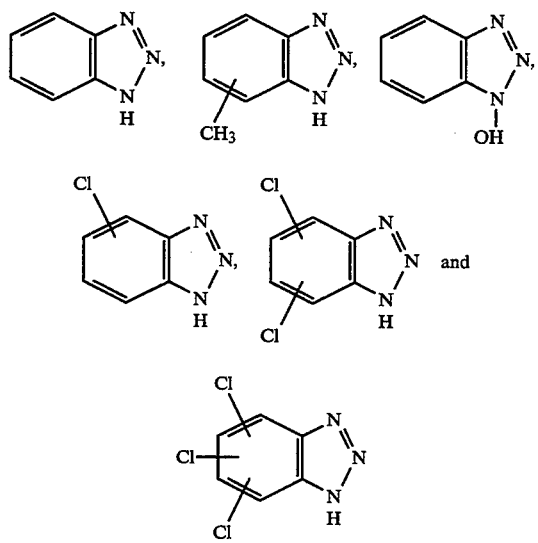

Compound of the above formula (2):
Pyrazoles such as

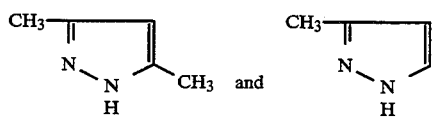

Compound of the above formula (3):

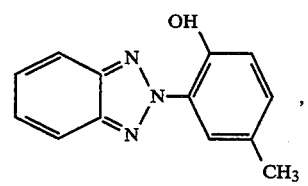

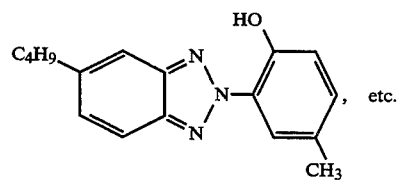

Compound of the above formula (4):

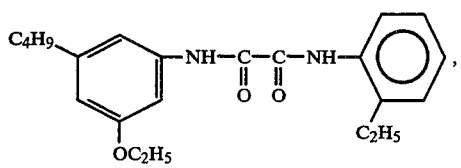

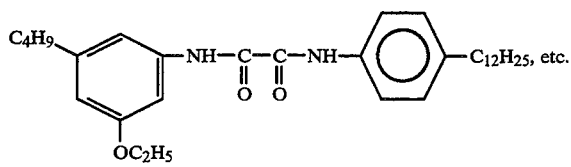

Compound of the above formula (5):

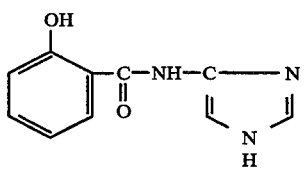

Compound of the above formula (6):

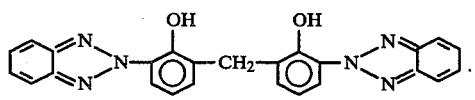

Among the above examples of the nitrogen-containing compound (B) in this invention, benzotriazoles of formula (1) are particularly preferred.

The nitrogen-containing compound (B) may be used either alone or in combination in the electrodeposition coating composition of this invention, and its amount ranges from 0.1 to 20 parts by weight, preferably 0.5 to 10 parts by weight per 100 parts by weight of the solids content of the resin component (A).

Photosensitive electrodeposition coating composition

The coating composition of this invention can be produced by mixing the resin component (A) with at least one nitrogen-containing compound (B) selected from the group consisting of the compounds represented by the general formulae (1) to (6).

On that occasion, the compound (B) may be added to the resin component (A) before the resin component (A) is dispersed or dissolved in water, and the mixture is then dispersed or dissolved in water. Alternatively, a solution of the compound (B) in a hydrophilic solvent may be added to an aqueous dispersion or solution of the resin component (A).

A hydrophilic solvent may be added to the electrodeposition coating composition in order to increase the flowability of the water-solubilized or water-dispersed electrodeposition paint further. Examples of the hydrophilic solvent are isopropanol, n-butanol, t-butanol, methoxyethanol, ethoxyethanol, butoxyethanol, diethylene glycol methyl ether, dioxane and tetrahydrofuran. Generally, the amount of the hydrophilic solvent used is desirably not more than 300 parts by weight per 100 parts by weight of the mixture of resin component (A) and the compound (B).

To increase the amount of the coating composition coated on the substrate, a hydrophobic solvent may also be added to the composition. Examples of the hydrophobic solvent include petroleum solvents such as toluene and xylene, ketones such as methyl ethyl ketone and methyl isobutyl ketone, esters such as ethyl acetate and butyl acetate, and hydrophobic alcohols such as 2-ethylhexyl alcohol). Usually, the amount of the hydrophobic solvent is desirably not more than 200 parts by weight per 100 parts by weight of the above mixture.

As required, other resins may be incorporated to adjust the properties of the electrodeposited film. It is also possible to add a dye or a pigment.

Production of the printed wiring substrate using the positive-type electrodeposition coating composition in this invention is performed as follows.

In an electrodeposition coating bath (a solids content in the bath: 3 to 30% by weight) is dipped a printed wiring substrate (e.g. a copper-clad plate) as an anode in the anionic electrodeposition coating. A DC current of 20 to 400 V is passed. The suitable passing time is 30 seconds to 5 minutes. The film thickness is 2 to 100 micrometers, preferably 3 to 20 micrometers as a dry film thickness.

After the electrodeposition coating, the coated product is withdrawn from the electrodeposition bath, and washed with water, followed by removing the moisture contained in the electrodeposited film with hot air, etc.

Subsequently, the surface of the thus formed photosensitive electrodeposited film is irradiated with actinic rays such as ultraviolet rays via a pattern mask (positive). As the ortho-quinonediazide compound in the exposed portion becomes a carboxylic acid via a ketene, it is removed by the developing treatment with a developer such as an alkali aqueous solution, making it possible to realize a high resolution.

The actinic light used for exposure in this invention preferably has a wavelength of 3000 to 4500 Å. Sources of this light are, for example, solar light, a mercury lamp, a xenone lamp and an arc light. Irradiation of the actinic light is carried out usually in an irradiation dose of 50 to 800 mj/cm$^2$, preferably 50 to 500 mj/cm$^2$.

The developing treatment is carried out by spraying weakly alkaline water against the surface of the coated film to wash away the exposed portions of the coated film. The weakly alkaline water may be, for example, sodium hydroxide, potassium hydroxide, sodium silicate, sodium carbonate or aqueous ammonia having pH of 8 to 12, which neutralizes the free carboxylic acid in the coated film to make it water-soluble.

The metal portion (non-circuit portion) exposed on the substrate by the development is removed by an ordinary etching treatment using a ferric chloride or copper chloride solution, for example. Then, the unexposed coated film on the circuit pattern is removed by dissolving with a Cellosolve-type solvent such as ethyl Cellosolve and ethyl Cellosolve acetate, an aromatic hydrocarbon solvent such as toluene and xylene, a ketone-type solvent such as methyl ethyl ketone and methyl isobutyl ketone, an acetate-type solvent such as ethyl acetate and butyl acetate, or a chlorine-type solvent such as trichloroethylene, or also with a sodium hydroxide or potassium hydroxide aqueous solution.

The positive-type photosensitive electrodeposition coating composition can be easily coated on an electrically conductive material such as copper foil by electrodeposition, and the electrodeposited film is dried to form a uniform photosensitive film. When light is irradiated onto the photosensitive film through a positive film, the exposed portion changes as described above and is developed with weakly alkaline water. The unexposed portion can also be removed by dissolving with the solvent or strong alkali solution. Accordingly, this can supersede conventional photosensitive films.

The electrodeposition coating composition of this invention is particularly suitable for the production of a printed circuit board having through-holes. This composition obviates a soldering step unlike the case of using a photosensitive dry film, and shortens the process of producing the printed circuit board. With a photocurable negative-type electrodeposition paint, it is difficult to form a cured film on through-holes of small diameters. In contrast, since the unexposed portion remains as a resist film in the present invention, the composition of this invention is suitable for the production of printed circuit board having through-holes of a small diameter.

Using the composition of this invention, the printed wiring substrate having landless through-holes can easily be produced by exposure via a circuit pattern mask designed so as not to shade the light from the through-hole portion.

Further excellent characteristics of this inventions are that the compound (B) is contained in the electrodeposition coating composition to give an excellent uniformity of a film thickness and permits no roughness of the coated surface even in the long-term operation and under the same electrodeposition conditions. An electrodeposition coating composition free from the compound (B) gives rise to problems in operation that when it is used for a long period of time, a developing time becomes long, a developing temperature has to be high, a time required to peel off a resist film after etching becomes long, and an alkali concentration has to be high, as well as problems in qualities that as a result a defect in circuit pattern increases and rust occurs on the surface of the copper circuit. On the other hand, if using the electrodeposition coating of this invention, a printed circuit board can be produced in a stable state even in the longterm operation without the aforesaid problems. The following Examples illustrate this invention in more detail. Parts and percentages in Examples are all by weight.

Production of a Hydroxyl-containing Ortho-quinonediazide Compound 1

A four-necked flask was charged with 269 parts of ortho-naphthoquinonediazidesulfonyl chloride and 1345 parts of dioxane, and with stirring at room temperature, 150 parts of N-methylethanolamine was added dropwise over 1 hour. After the dropwise addition, the mixture was stirred further for about 3 hours. After determining that the absorption of the amino group near 3300 cm$^{-1}$ in the IR spectrum of the reaction mixture disappeared, the reaction was terminated.

The resulting solution was put in deionized water, and the quaternary amine which trapped hydrochloric acid formed during the reaction was removed. The product was then extracted with isobutyl acetate, and the solvent was evaporated. The residue was dried in a dessicator under reduced pressure to give a hydroxyl-containing ortho-quinonediazide compound 1.

PRODUCTION EXAMPLE 1

A four-necked flask was charged with 290 parts of diethylene glycol dimethyl ether, and with stirring the temperature was raised to 110° C. Then, a mixture of 202 parts of n-butyl methacrylate, 32 parts of acrylic acid, 92 parts of m-isopropenyl-alpha, alpha-dimethyl-benzyl isocyanate and 20 parts of azobisbutyrovaleronitrile was added dropwise over the course of 3 hours. The mixture was maintained for 1 hour, and a mixture of 14 parts of methyl isobutyl ketone and 3 parts of azobisbutyrovaleronitrile was added dropwise over 1 hour. The mixture was further maintained for 5 hours. Thereafter, the temperature was lowered to 50° C., and 142 parts of the hydroxyl-containing ortho-quinonediazide compound 1 and 4.6 parts of dibutyltin diacetate were added. The mixture was maintained for 3 hours at 50° C. It was determined that the absorption of the isocyanate group near 2250 cm$^{-}$ in the infrared spectrum disappeared, and a positive-type photosensitive resin (acid value 40.7) having a viscosity of F and a molecular weight of 7,300 was obtained.

PRODUCTION EXAMPLE 2

|  | parts |  |
| --- | --- | --- |
| 2-Methoxypropanol | 450 | I |
| n-Butyl acrylate | 692 |  |
| Styrene | 200 | II |
| Acrylic acid | 108 |  |
| t-Butylperoxy octoate | 50 |  |
| 2-Methoxypropanol | 50 | III |
| t-Butylperoxy octoate | 10 |  |

The solvent I was charged into a flask and heated to 110° C. The mixture II was added dropwise at 110° C. for 3 hours, and the temperature was kept at 110° C. for 1 hour. Subsequently, the mixture III was added dropwise at 110° C. for 1 hour and the temperature of 110° C. was further kept for 2 hours to afford an acrylic resin solution 1 having a solids content of 67%, a number average molecular weight of 11,000 and an acid value of 84.

Production of a Photosensitive Compound 1

A four-necked flask was charged with 307 parts of a hydroxyl-containing quinonediazide compound 1,500 parts of dimethyl diglyme and 3 parts of dibutyltin dilaurate, and heated at 60° C. with stirring. To this mixture was added 185 parts of an aliphatic polyisocyanate ("Takenate D-165N": a tradename for a product of Takeda Chemical Industries, Ltd., an isocyanate content of 22.7%, a number average molecular weight of about 650) over the course of 30 minutes, and the reaction was performed at 60° C. until absorption of the isocyanate group near 2250 cm$^{-1}$ in the IR spectrum disappeared. Subsequently, dimethyl diglyme was distilled off to the solids content of 60% at 60° C. under reduced pressure. There was obtained a photosensitive compound 1 containing 47.4% of quinonediazidesulfone units (about 3.5 units/molecule) and having a number average molecular weight of 1,700.

EXAMPLE 1

To 772 parts of the resin solution in Production Example 1 was added a solution of 5 parts of a compound represented by the formula

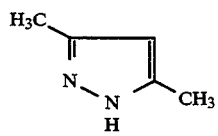

in 10 parts of butyl cellosolve. After they were mixed, the mixture was neutralized with 28 parts of triethylamine. Subsequently, while stirring the content, deionized water was gradually added until the solids content reached 10% to give an electrodeposition coating bath with pH of 7.8.

EXAMPLES 2 to 4

An electrodeposition coating bath was produced in the same way as in Example 1 except using a solution of a compound shown in Table 1.

in 5 parts of benzyl alcohol in Example 6 and a solution 20 parts of a compound represented by the formula

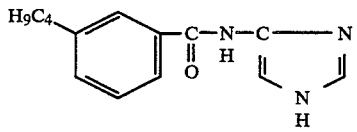

in 7 parts of ethylene glycol mono-2-ethylhexylether in Example 7.

TABLE 1

| Example | Compound | | Solvent | | pH |
|---|---|---|---|---|---|
| 2 | (structure) | 10 parts | Cellosolve | 15 parts | 8.1 |
| 3 | (structure) | 15 parts | Benzyl alcohol<br>Butyl cellosolve | 5 parts<br>10 parts | 8.2 |
| 4 | (structure) | 20 parts | n-Butanol<br>Butyl cellosolve | 5 parts<br>15 parts | 8.0 |

EXAMPLE 5

One hundred parts of the acrylic resin solution 1 obtained in Production Example 2 was mixed with 8.5 parts of triethylamine and 5 parts of butylcarbitol for neutralization. Subsequently, 25 parts of the photosensitive compound 1 and 10 parts of a compound represented by the formula

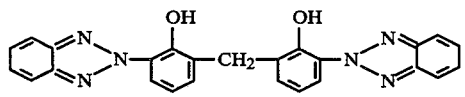

were added and thoroughly mixed. While stirring the mixture by a high-speed mixer at a stirring rate of 1,000 to 2,000 rpm, deionized water was gradually added such that the solids content became 8%. There was obtained a stable dispersion. The pH was 7.9, and the amount of the quinonediazidesulfonic acid was 10.6 parts per 100 parts of the acrylic resin.

EXAMPLES 6 & 7

Electrodeposition coating baths were produced as in Example 5 except using a solution of 10 parts of a compound represented by the formula

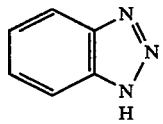

COMPARATIVE EXAMPLE 1

An electrodeposition coating bath was produced (pH 7.7) as in Example 1 except that the compound represented by the formula in Example 1 was not used.

COMPARATIVE EXAMPLE 2

An electrodeposition coating bath was produced (pH 7.8) as in Example 1 except that the compound represented by the formula in Example 5 was not used.

A two-sided circuit plate for printed wiring board with a copper thickness of 35 microns obtained by subjecting an insulated plate having through-holes 0.4 mm in diameter to electroless copper plating and electrolytic copper plating was dipped in the aqueous dispersion of 25° C. obtained in each of Examples 1 to 7 and Comparative Examples 1 and 2. Said plate was used as an anode, and connected with the opposite pole dipped in the aqueous dispersion. After the electrodeposition was carried out under fixed electricity passage conditions shown in Table 2, the circuit plate was washed with water and dried at 80° C. for 5 minutes. The electrodeposited films were all free from pinholes and had the uniform thickness. The insides of the through-holes were completely coated.

TO the obtained coating was closely adhered a positive photomask, and both sides were exposed to light under exposure conditions shown in Table 3. Subsequently, the resulting product was developed under given conditions shown in Table 3, and etched to remove the resin coating. The obtained circuit pattern was observed by an electron microscope and found to be a complete circuit pattern having a circuit width (conductor width) of 30 micrometers. The unexposed through-hole portion remained completely without copper etching to ensure conduction of both sides.

Moreover, the copper substrates were coated correspondingly to 5 turnovers (*) in the electrodeposition coating baths (the solids content of the bath was periodically measured, and whenever the solids content was decreased by 0.5%, a supplemental coating was added to the bath in a necessary amount to make the solids content the same as the solids content in starting the coating). Subsequently, using the electrodeposition coated films, exposure, development, etching and peeling off were conducted in this sequence as stated above. The results are shown in Table 4.

(*) Turnover: 1 turnover indicates a time when a solids content of a coating in a path is completely withdrawn from a bath by electrodeposition or physical adhesion calculatively.

In Examples, the thickness of the film obtained under the same electrodeposition conditions remained almost unchanged after the continual coating of 5 turnovers. While, in Comparative Examples, the film thickness was notably decreased.

When the circuits were formed using the resulting electrodeposition coated films, the circuit patterns in Examples were exactly the same as those before the continual coating test even if the conditions of development, exposure, etching and peeling off were unchanged. While, in Comparative Examples, it was necessary to increase the developing temperature and prolong the time; in the peeling off procedure, it was required to increase the concentration of sodium hydroxide and elevate the temperature.

In the circuit patterns in Comparative Examples, the circuits were heavily damaged and the copper foil in etching remained much in comparison to those in Examples.

TABLE 2

|  | Example | | | | | | | Comparative Example | |
|---|---|---|---|---|---|---|---|---|---|
|  | 1 | 2 | 3 | 4 | 5 | 6 | 7 | 1 | 2 |
| Electrodeposition coating conditions | Fixed current $50mA/dm^2$ 120" | Fixed voltage 60V 120" | Fixed voltage 80V 100" | Fixed current $50mA/dm^2$ 180" | Fixed voltage 100V 120" | Fixed current $35mA/dm^2$ 120" | Fixed current $50mA/dm^2$ 120" | Fixed current $50mA/dm^2$ 120" | Fixed voltage 100V 120" |
| Film thichness ($\mu$) | 12 | 9 | 10 | 8 | 11 | 10 | 10 | 10 | 10 |

TABLE 3

|  | Example | | | | | | | Comparative Example | |
|---|---|---|---|---|---|---|---|---|---|
|  | 1 | 2 | 3 | 4 | 5 | 6 | 7 | 1 | 2 |
| Exposure conditions (80W ultrahigh pressure mercury lamp) $mj/cm^2$ | 150 | 300 | 200 | 300 | 300 | 300 | 300 | 150 | 300 |
| Developer | 2% sodium metasilicate | 2% sodium metasilicate | 1.5% sodium metasilicate | 1.5% sodium metasilicate | 2% sodium metasilicate | 2% sodium metasilicate | 2% sodium metasilicate | 2% sodium metasilicate | 2% sodium metasilicate |
| Developing temperature | 30° C. | 30° C. | 30° C. | 30° C. | 30° C. | 30° C. | 30° C. | 30° C. | 30° C. |
| Developing time | 100" | 100" | 120" | 120" | 100" | 100" | 100" | 150" | 150" |
| Peeling of a coating | 3% sodium hydroxide | 3% sodium hydroxide | 3% sodium hydroxide | methylene hydroxide | 3% sodium hydroxide | 3% sodium hydroxide | 3% sodium hydroxide | 3% sodium hydroxide | 3% sodium hydroxide |
| Peeling temperature | 50° C. | 50° C. | 50° C. | 25° C. | 50° C. | 50° C. | 50° C. | 25° C. | 25° C. |

TABLE 4

|  | Example | | | | | | | Comparative Example | |
|---|---|---|---|---|---|---|---|---|---|
|  | 1 | 2 | 3 | 4 | 5 | 6 | 7 | 1 | 2 |
| Electrodeposition coating conditions | Fixed current $50mA/dm^2$ 120" | Fixed voltage 60V 120" | Fixed voltage 80V 100" | Fixed current $50mA/dm^2$ 180" | Fixed voltage 100V 120" | Fixed current $35mA/dm^2$ 120" | Fixed current $50mA/dm^2$ 120" | Fixed current $50mA/dm^2$ 120" | Fixed voltage 100V 120" |
| Film thichness ($\mu$) | 11 | 9 | 10 | 8 | 11 | 10 | 9 | 5 | 6 |
| Exposure conditions ($mj/cm^2$) | 150 | 300 | 300 | 300 | 300 | 300 | 300 | 150 | 300 |
| Developer | 2% sodium metasilicate | 2% sodium metasilicate | 2% sodium metasilicate | 2% sodium metasilicate | 2% sodium metasilicate | 2% sodium metasilicate | 2% sodium metasilicate | 2% sodium metasilicate | 2% sodium metasilicate |
| Developing temperature | 30° C. | 30° C. | 30° C. | 30° C. | 30° C. | 30° C. | 30° C. | 45° C. | 450° C. |
| Developing time | 100" | 100" | 120" | 120" | 100" | 100" | 100" | 240" | 270" |
| Peeling of a coating | 3% sodium hydroxide | 3% sodium hydroxide | 3% sodium hydroxide | methylene chloride | 3% sodium hydroxide | 3% sodium hydroxide | 3% sodium hydroxide | 5% sodium hydroxide | 7% sodium hydroxide |
| Peeling | 50° C. | 50° C. | 50° C. | 25° C. | 50° C. | 50° C. | 50° C. | 60° C. | 60° C. |

TABLE 4-continued

| | Example | | | | | | | Comparative Example | |
|---|---|---|---|---|---|---|---|---|---|
| | 1 | 2 | 3 | 4 | 5 | 6 | 7 | 1 | 2 |
| temperature | | | | | | | | | |

What we claim is:

1. A positive-type photosensitive electrodeposition coating composition comprising
   (A) a resin component containing in the same molecule at least one photosensitive group and an anion-forming group, the photosensitive group being selected from the group consisting of an ortho-benzoquinonediazidesulfone unit represented by the general formula

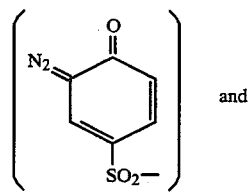

and an ortho-naphthoquinonediazidesulfone unit represented by the general formula

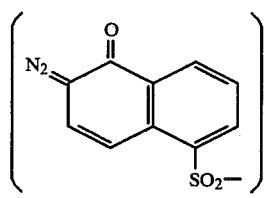

the amount of the photosensitive group in the resin component being 5 to 60% by weight, the content of the anion-forming group being 0.2 to 2.5 mols per Kg of the solid content of the resin, and the resin having a number-average molecular weight of 3,000 to 100,000, and
   (B) at least one of the nitrogen-containing compounds represented by the following general formulae (1) to (6):

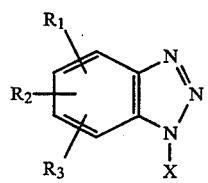

hydroxyl group, $R_1$, $R_2$ and $R_3$ independently represent a hydrogen atom, a chlorine atom or an alkyl group having 1 to 6 carbon atoms,

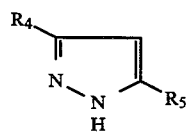

wherein $R_4$ and $R_5$ independently represent a hydrogen atom, or an alkyl group having 1 to 6 carbon atoms,

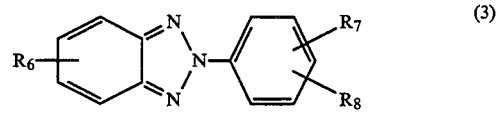

wherein $R_6$, $R_7$ and $R_8$ independently represent a hydrogen atom, a hydroxyl group or an alkyl group having 1 to 12 carbon atoms,

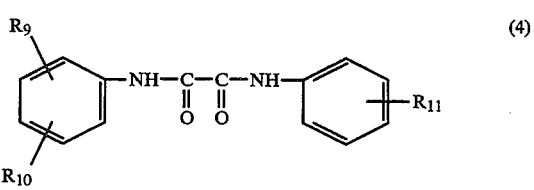

wherein $R_9$, $R_{10}$ and $R_{11}$ independently represent a hydrogen atom, a hydroxyl group, an alkyl group having 1 to 12 carbon atoms or

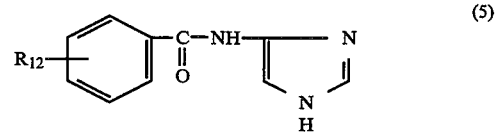

an alkoxy group having 1 to 12 carbon atoms,
   wherein $R_{12}$ represents a hydrogen atom, a hydroxyl group, an alkyl group having 1 to 12 carbon atoms or an alkoxy group having 1 to 12 carbon atoms,

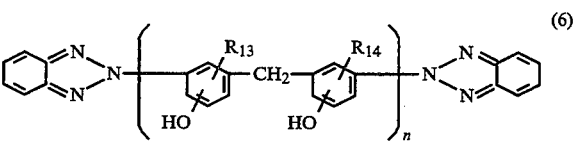

wherein $R_{13}$ and $R_{14}$ independently represent a hydrogen atom or an alkyl group having 1 to 12 carbon atoms and n is an integer of 1 to 3.

2. The composition of claim 1 wherein the resin component (A) is an acrylic resin.

3. The composition of claim 1 wherein the anion-forming group is a carboxyl group.

4. The composition of claim 1 wherein the nitrogen-containing compound (B) is a benzotriazole represented by the general formula (1).

5. The composition of claim 4 wherein the benzotriazole is selected from the group consisting of

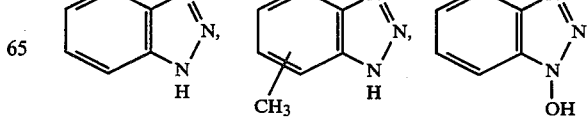

-continued

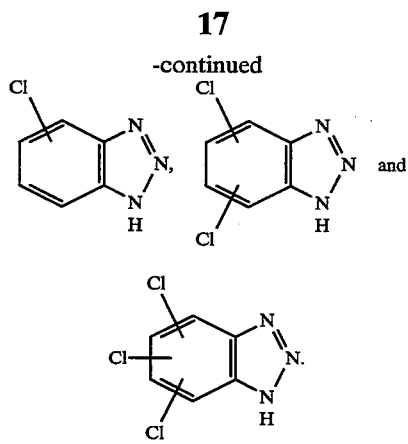

and

6. The composition of claim 1 wherein the amount of the nitrogen-containing compound (B) is 0.1 to 20 parts by weight per 100 parts by weight of the solids content of the resin component (A).

7. A process for producing a circuit plate, which comprises
  (i) a step of coating the electrodeposition coating composition of claim 1 on a surface of a circuit substrate having an electrically conductive coating to form a positive-type photosensitive coating,
  (ii) a step of exposing the positive-type photosensitive coating to light via a pattern mask,
  (iii) a step of forming an etching pattern by removing the photosensitive coating in the exposed portion,
  (iv) a step of removing the exposed electrically conductive coating by etching, and
  (v) removing the photosensitive coating on the circuit pattern.

* * * * *